(12) United States Patent
Chang

(10) Patent No.: US 7,880,159 B2
(45) Date of Patent: Feb. 1, 2011

(54) PHASE CHANGE MEMORY DEVICE IN WHICH A DISTANCE BETWEEN A LOWER ELECTRODE AND A GROUND LINE IS INCREASED TO SECURE THE SENSING MARGIN OF A CELL AND METHOD FOR MANUFACTURING THE SAME

(75) Inventor: Heon Yong Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/559,736

(22) Filed: Sep. 15, 2009

(65) Prior Publication Data

US 2010/0001251 A1    Jan. 7, 2010

Related U.S. Application Data

(62) Division of application No. 11/855,469, filed on Sep. 14, 2007, now Pat. No. 7,608,850.

(30) Foreign Application Priority Data

Dec. 27, 2006    (KR) .................. 10-2006-0135736

(51) Int. Cl.
*H01L 29/02* (2006.01)
(52) U.S. Cl. ............ 257/4; 257/2; 257/5; 257/E29.002; 438/102; 438/103; 365/163
(58) Field of Classification Search ............... 257/1–5; 438/102–103; 365/163
See application file for complete search history.

(56) References Cited

U.S. PATENT DOCUMENTS

2003/0086291 A1    5/2003    Lowrey (Continued)

FOREIGN PATENT DOCUMENTS

KR    1020040047272 A    6/2004

(Continued)

OTHER PUBLICATIONS

USPTO Office Action mailed Nov. 18, 2008 for parent U.S. Appl. No. 11/855,469.

(Continued)

*Primary Examiner*—Bradley K Smith
*Assistant Examiner*—Jami M Valentine
(74) *Attorney, Agent, or Firm*—Ladas & Parry LLP

(57) ABSTRACT

A phase change memory device includes a semiconductor substrate having active regions and an isolation structure; gate lines extending in a direction perpendicular to the active regions; a source region and a drain region formed in a surface of each active region; a dot type lower electrode including a first contact plug formed in the drain region; second contact plugs formed in the source region and the isolation structure forming a line parallel to the gate line; a lower electrode contact formed on the lower electrode; a phase change layer and an upper electrode formed on the lower electrode contact; an upper electrode contact formed on the upper electrode; contacts for ground lines, formed between the active regions to come into contact with the second contact plugs; a bit line formed in the active region; and ground lines formed between the active regions.

2 Claims, 16 Drawing Sheets

U.S. PATENT DOCUMENTS

2006/0278899 A1 12/2006 Chang et al.
2007/0165452 A1* 7/2007 Hayakawa .................. 365/163

FOREIGN PATENT DOCUMENTS

| KR | 1020040104834 A | 12/2004 |
|----|-----------------|---------|
| KR | 1020060001061 A | 1/2006  |

OTHER PUBLICATIONS

USPTO Office Action mailed Dec. 22, 2008 for parent U.S. Appl. No. 11/855,469.

* cited by examiner

PHASE CHANGE MEMORY DEVICE IN WHICH A DISTANCE BETWEEN A LOWER ELECTRODE AND A GROUND LINE IS INCREASED TO SECURE THE SENSING MARGIN OF A CELL AND METHOD FOR MANUFACTURING THE SAME

CROSS-REFERENCE TO RELATED APPLICATIONS

The present application claims priority to Korean patent application number 10-2006-0135736 filed on Dec. 27, 2006, which is incorporated herein by reference in its entirety.

BACKGROUND OF THE INVENTION

The present invention relates to a phase change memory device and a method for manufacturing the same, and more particularly, to a phase change memory device in which a distance between a lower electrode and a ground line is increased so as to secure the sensing margin of a cell and a method for manufacturing the same.

In general, memory devices are largely divided into a volatile RAM (random access memory), which loses inputted information when power is interrupted and a non-volatile ROM (read-only memory), which can continuously maintain the stored state of inputted information even when power is interrupted. When considering the volatile RAM, a DRAM (dynamic RAM) and when considering SRAM (static RAM) can be mentioned, and as the non-volatile ROM, a flash memory device such as an EEPROM (electrically erasable and programmable ROM) can be mentioned.

As is well known in the art, while the DRAM is an excellent memory device, the DRAM must have high charge storing capacity, and to this end, since the surface area of an electrode must be increased, it is difficult to accomplish a high level of integration. Further, in the flash memory device, due to the fact that two gates are stacked on each other, a high operation voltage is required when compared to a source voltage. As a result a separate booster circuit is needed to form the voltage necessary for write and delete operations, making it difficult to accomplish a high level of integration.

To improve upon the current memory devices, researches have been active making an effort to develop a novel memory device that has a simple configuration and is capable of accomplishing a high level of integration while retaining the characteristics of the non-volatile memory device. A phase change memory device recently disclosed in the art is a product of this effort.

In the phase change memory device, a phase change, which occurs in a phase change layer interposed between a lower electrode and an upper electrode, from a crystalline state to an amorphous state is due to current flow between the lower electrode and the upper electrode. The information stored in a cell is recognized by the medium of a difference in resistance between the crystalline state and the amorphous state.

In detail, in the phase change memory device, a chalcogenide layer being a compound layer made of germanium (Ge), stibium (Sb) and tellurium (Te) is employed as a phase change layer. As a current is applied, the phase change layer undergoes a phase change by heat, that is, Joule heat, between the amorphous state and the crystalline state. Accordingly, in the phase change memory device, when considering the fact that the specific resistance of the phase change layer in the amorphous state is higher than the specific resistance of the phase change layer in the crystalline state, in a read mode, whether the information stored in a phase change cell has a logic value of '1' or '0' is determined by sensing the current flowing through the phase change layer.

FIG. 1 is a cross-sectional view illustrating a conventional phase change memory device.

Referring to FIG. 1, gates 110 are formed in the active region of a semiconductor substrate 100, which is delimited by an isolation structure (not shown). A source region 106S and a drain region 106D are formed in the surface of the semiconductor substrate 100 on both sides of the gate 110. A first oxide layer 112 and a second oxide layer 113 are formed on the overall surface of the substrate to cover the gates 110. A first metal plug 120 to come into contact with the drain region 106D and a second metal plug 121 to come into contact with the source region 106S are respectively formed in portions of the first oxide layer 112 which respectively correspond to a zone to be formed with a phase change cell and a zone to be formed with a line to be applied with a ground voltage (hereinafter, referred to as a 'ground line (Vss line)'). In the second oxide layer 113, a lower electrode 130 is formed to come into contact with the first metal plug 120 in the phase change cell forming zone, and a ground line 171 is formed to come into contact with the second metal plug 121 in the ground line forming zone.

A third oxide layer 114 is formed on the second oxide layer 113 including the lower electrode 130 and the ground line 171. A lower electrode contact 140 having the shape of a plug is formed in the third oxide layer 114, and the lower electrode contact comes into contact with the lower electrode 130. A phase change layer 149 and an upper electrode 150 are sequentially stacked on the third oxide layer 114 to come into contact with the lower electrode contact 140. The unexplained reference numeral 105 designates a gate spacer.

In the conventional phase change memory device, as described above, the lower electrode 130 is formed in the drain region 106D to come into contact with the lower electrode contact 140, and the ground line 171 is formed in the source region 106S to apply the ground voltage. In this regard, if the distance "a" between the lower electrode 130 and the ground line 171 is decreased, due to the difference in voltage between the lower electrode 130 and the ground line 171, a leakage current is generated and the voltage of the ground line 171 increases.

The increase in the voltage of the ground line 171 causes a phenomenon in which when sensing the cells through bit lines connected to the upper electrodes 150, all cells are sensed as the amorphous state with high resistance. As a result, the distance 'a' between the lower electrode 130 and the ground line 171 serves as a substantial obstacle in decreasing the size of a unit cell in the conventional phase change memory device.

SUMMARY OF THE INVENTION

An embodiment of the present invention is directed to a phase change memory device in which a distance between a lower electrode and a ground line is increased so as to secure the sensing margin of a cell, and a method for manufacturing the same.

In one aspect, a phase change memory device comprises a semiconductor substrate having bar type active regions and an isolation structure for delimiting the active regions; a plurality of gate lines formed on the semiconductor substrate to extend in a direction perpendicular to the active regions; a source region and a drain region formed in a surface of each active region on both sides of each gate line; a dot type lower electrode formed in the drain region and including a first contact plug; second contact plugs formed in the source region and isolation structure forming a line parallel to the gate line; a lower electrode contact formed on the lower electrode; a phase change layer and an upper electrode formed on the lower electrode contact; an upper electrode contact formed on the upper electrode; a plurality of contacts for ground lines, formed between the active regions to come into contact with the second contact plugs; a bit line formed in the active region to be connected with the upper electrode contact; and ground lines formed between the active regions to be connected with the contacts for ground lines.

The lower electrode is formed to have a size greater than the first contact plug.

The second contact plugs come into contact with the contacts for ground lines. The portion of the second contact plug which directly contacts the ground lines has a size greater than a portion of the second contact plugs which does not directly contact the second contact plug. For example, a portion of the second contact, which is located only between active regions and which is above the portion not directly contacting the ground line, is wider than the portion that does not directly contact the ground line.

The ground lines are formed selectively between the plurality of active regions.

The distance between active regions in which a ground line is formed has a width greater than the distance between two active regions in which a ground line is not formed.

In another embodiment, a method for manufacturing a phase change memory device comprises the steps of preparing a semiconductor substrate which has bar type active regions and an isolation structure for delimiting the active regions; forming a plurality of gate lines on the semiconductor substrate to extend in a direction perpendicular to the active regions; forming a source region and a drain region in a surface of each active region on both sides of each gate line; forming a dot type lower electrode including a first contact plug in the drain region of the substrate and forming second contact plugs in the source region and the isolation structure forming a line parallel to the gate line; forming a lower electrode contact on the lower electrode; forming a phase change layer and an upper electrode on the lower electrode contact; forming an upper electrode contact on the upper electrode and forming a plurality of contacts for ground lines between the active regions to come into contact with the second contact plugs; and forming a bit line in the active region to be connected with the upper electrode contact and forming ground lines between the active regions to be connected with the contacts for ground lines.

The lower electrode is formed to have a size greater than the first contact plug.

The second contact plugs come into contact with the contacts for ground lines. The portion of the second contact plug which directly contacts the ground lines has a size greater than a portion of the second contact plugs which does not directly contact the second contact plug. For example, a portion of the second contact, which is located only between active regions and which is above the portion not directly contacting the ground line, is wider than the portion that does not directly contact the ground line.

The ground lines are formed selectively between the active regions.

The distance between active regions in which the ground line is formed has a width greater than the distance between two active regions in which the ground line is not formed.

In another embodiment of the present invention, a phase change memory device may comprise contact plugs which are formed in the shape of a line and which are located between gate lines. The contact plugs come into contact with contacts for ground lines. The portion of the second contact plug which directly contacts the ground lines has a size greater than a portion of the second contact plugs which does not directly contact the second contact plug. For example, a portion of the second contact, which is located only between active regions and which is above the portion not directly contacting the ground line, is wider than the portion that does not directly contact the ground line.

DESCRIPTION OF SPECIFIC EMBODIMENTS

Figure 1:
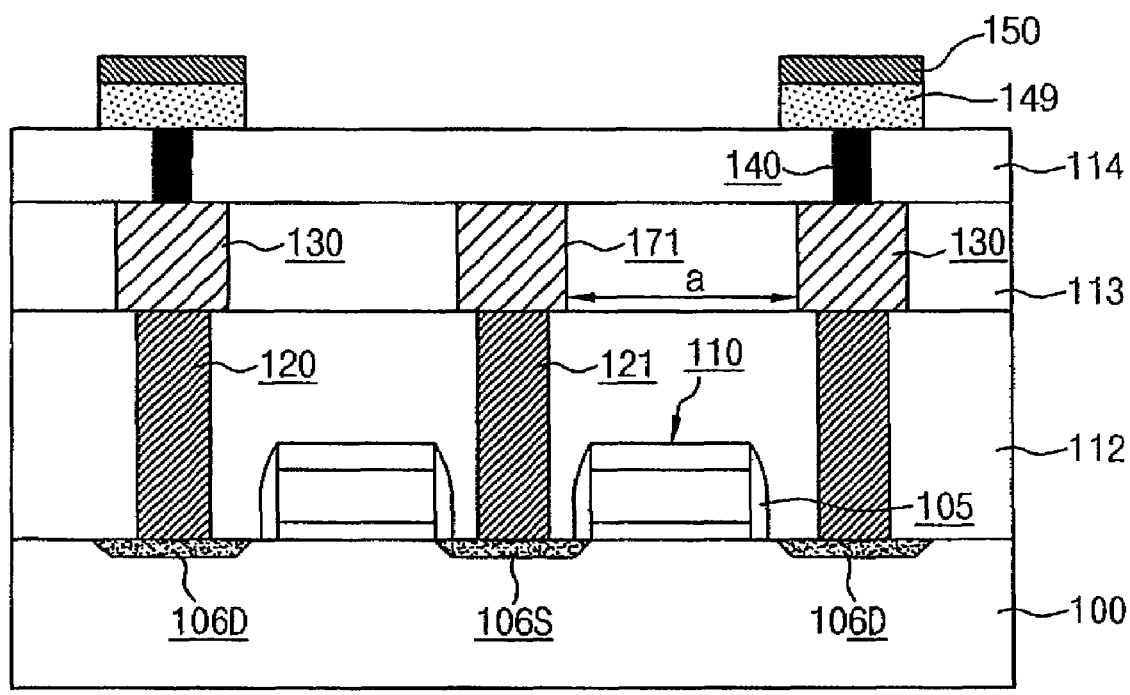
FIG. 1 is a cross-sectional view illustrating a conventional phase change memory device.
Figure 2:
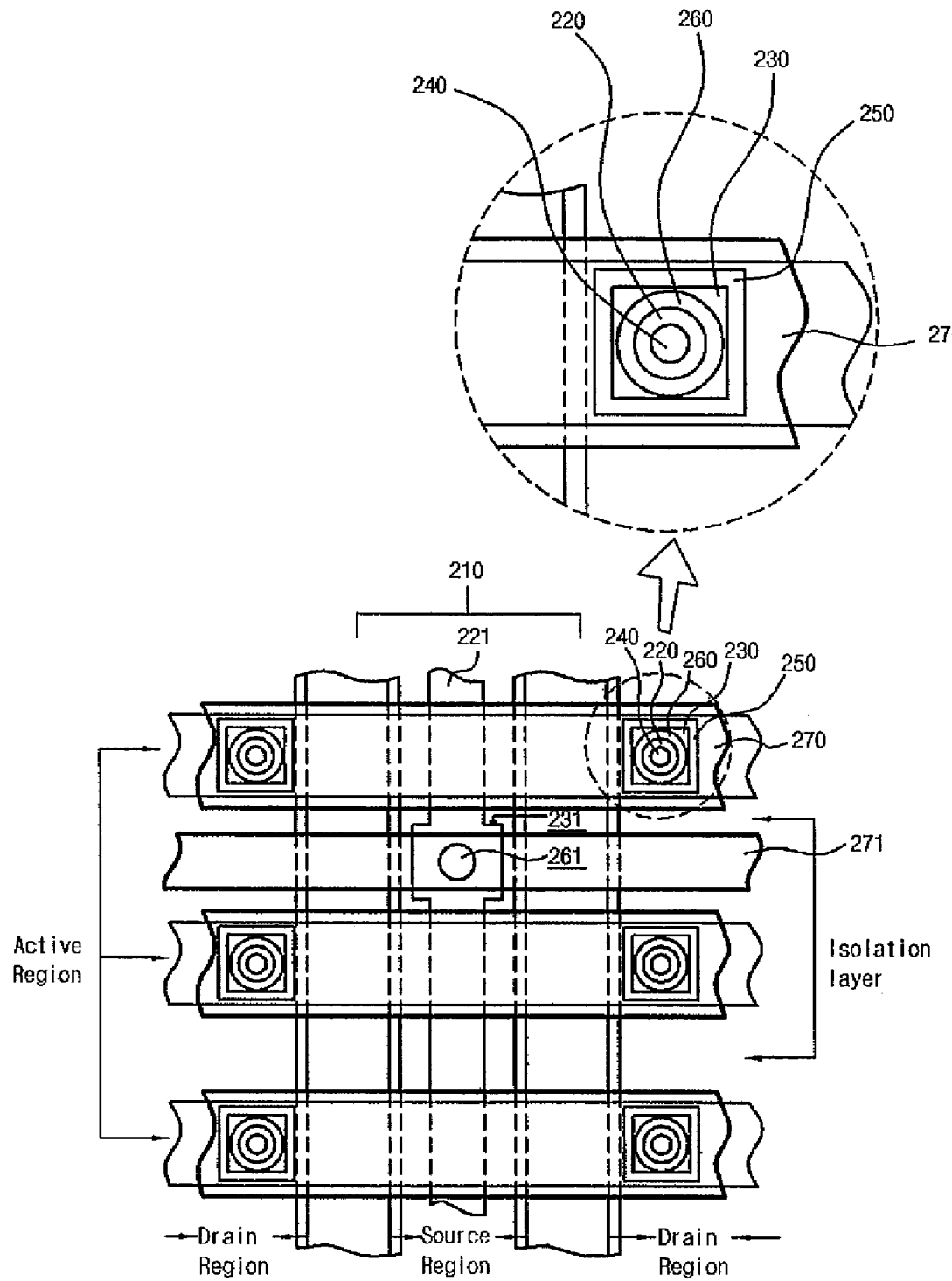
FIG. 2 is a plan view illustrating a phase change memory device in accordance with an embodiment of the present invention.

FIG. 2 is a plan view illustrating a phase change memory device in accordance with an embodiment of the present invention. Referring to FIG. 2, in the phase change memory device according to an embodiment of the present invention, dran regions and source regions are formed on both sides of the gate lines 210. Lower electrodes 230 and first contact plugs 220 are formed in drain regions. Second contact plug 221 is formed in the source regions and isolation structures, thereby forming a line running parallel to the gate lines 210. Second contact plug 231 is formed in the isolation structure. Further, contacts 261 for ground lines are formed to come into contact with the second contact plugs 231. The second contact plugs 231, which come into contact with the contacts 261 for ground lines, are portions formed on the isolation structure, and the second contact plugs 231 have a size (width) greater than that of the second contact plug 221.

When forming bit lines 270, which are connected with upper electrode contacts 260 in the active regions, ground lines 271 are simultaneously formed between the active regions to come into contact with the contacts 261 for ground lines. The unexplained reference numeral 250 designates a stack pattern of a phase change layer and an upper electrode.

Therefore, in the phase change memory device according to the present invention, the second contact plug 221 is formed in the source regions and the isolation structure in a line parallel to the gate lines. The second contact plugs 231 are formed in the isolation structures between the active regions. The contacts 261 for ground lines are formed to come into contact with the second contact plugs 231 and the ground lines 271 are formed to come into contact with the contacts 261 for ground lines. As a consequence, the distance between the lower electrode 230 formed in the drain region and the second contact plugs 221 and 231 formed in the isolation structure can be increased when compared to the conventional art.

FIGS. 3A through 3G are plan and cross-sectional views illustrating the process steps of a method for manufacturing a phase change memory device in accordance with another embodiment of the present invention.

Figure 3A:
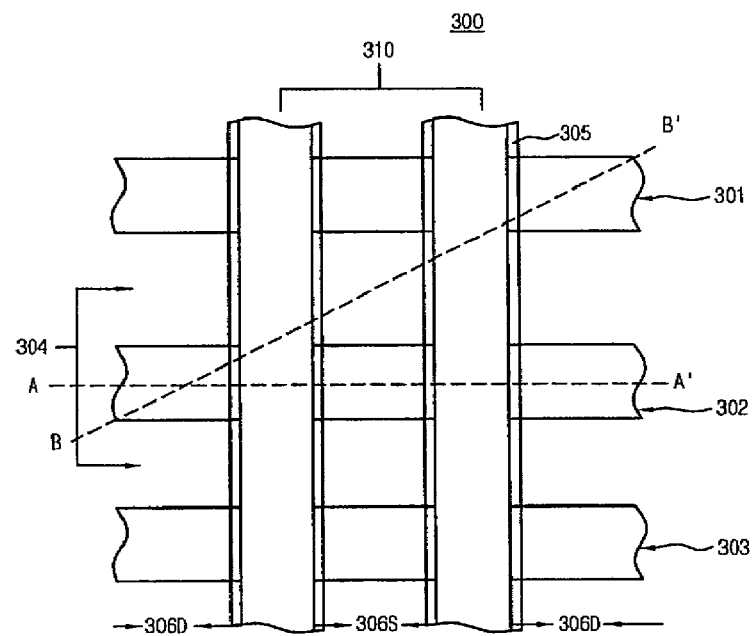
FIGS. 3A through 3G are plan and cross-sectional views illustrating the process steps of a method for manufacturing a phase change memory device in accordance with another embodiment of the present invention.
Figure 3A:
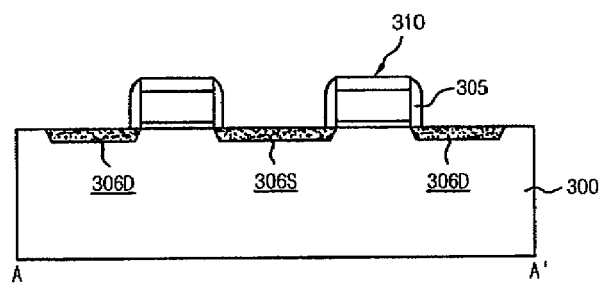
Figure 3A:
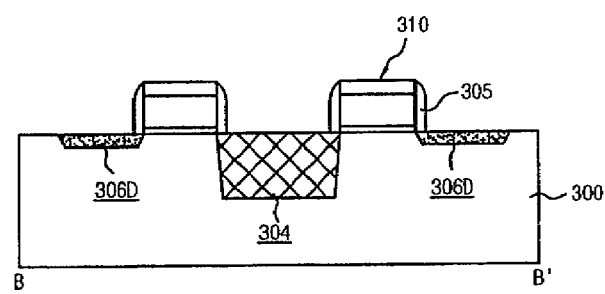

Referring to FIG. 3A, a semiconductor substrate 300 is prepared in which a plurality of bar type active regions including a first active region 301, a second active region 302 and a third active region 303, are located parallel to each other and spaced apart from one another. An isolation structure 304 is formed to delimit the plurality of active regions. The first through third active regions 301 through 303 are formed such that the distance between the first and second active regions 301 and 302 is greater than the distance between the second and third active regions 302 and 303.

A plurality of gate lines 310 on the semiconductor substrate 300 are formed in such a way as to extend in the direction perpendicular to the active regions 301, 302 and 303 After forming the plurality of gate lines 310, spacers 305 are formed on both sidewalls of the gate lines 310. A source region 306S and a drain region 306D are formed in the surfaces of the active regions on both sides of each gate line 310 formed with the spacers 305.

Figure 3B:
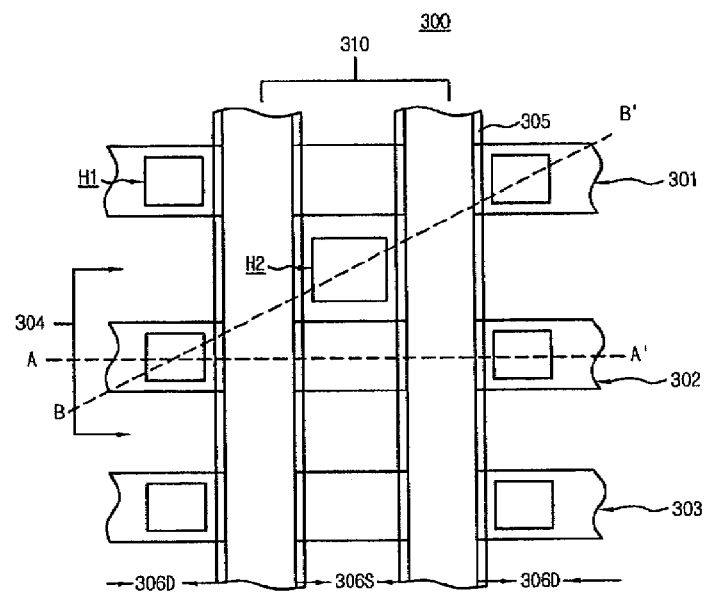
Figure 3B:
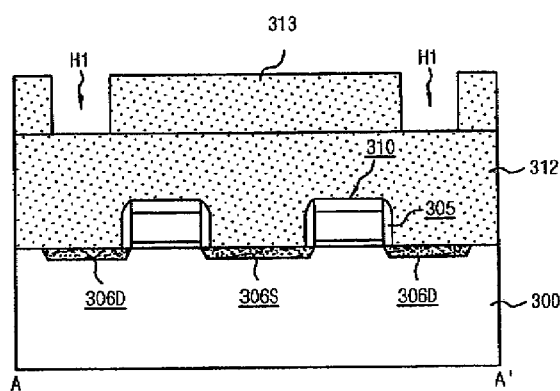
Figure 3B:
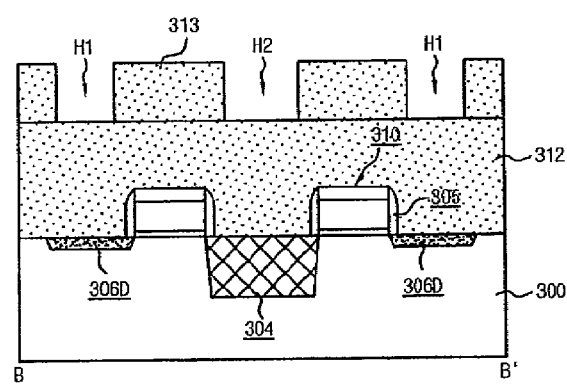

Referring to FIG. 3B, a first interlayer dielectric 312 and a second interlayer dielectric 313 are deposited on the overall surface of the semiconductor substrate 300 such that the gate lines 310 are covered. The second interlayer dielectric 313 is then etched to form a first contact hole H1 in the drain regions 306D in such a way as to delimit a lower electrode forming zone, and a second contact hole H2 is defined in the portion of the isolation structure 304 between the first active region 301 and the second active region 302 in such a way as to expose the first interlayer dielectric 312.

Figure 3C:
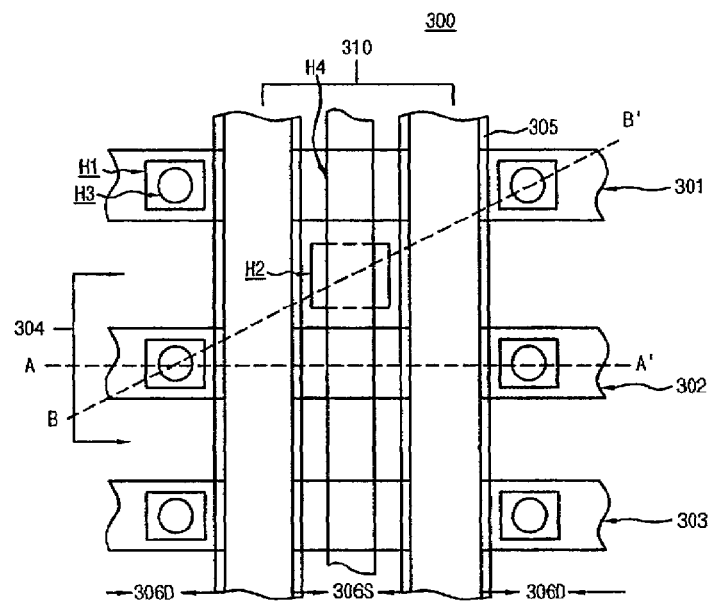
Figure 3C:
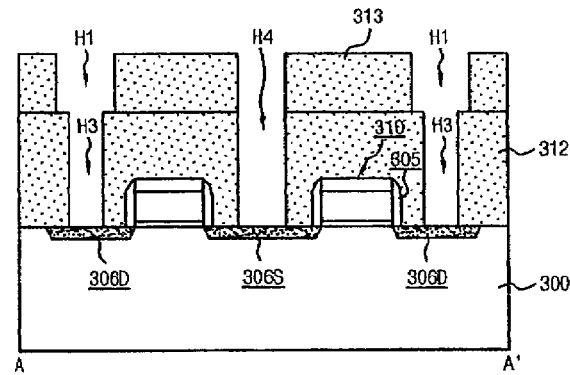
Figure 3C:
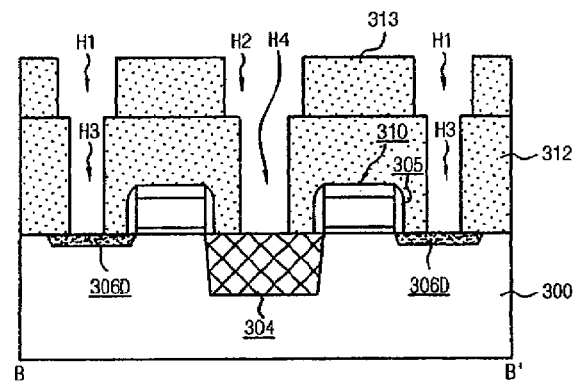

Referring to FIG. 3C, by etching the portion of the first interlayer dielectric 312 exposed through the first contact hole H1, a third contact hole H3 is defined in such a way as to delimit a contact plug forming zone in the drain areas 306D. The third contact hole H3 is defined to have a size smaller than the first contact hole H1. By etching the first interlayer dielectric 312 between the gate lines, a fourth contact hole H4 is defined in the source regions 306S and the isolation structure 304. The fourth contact hole H4 is formed in a line parallel to the gate line 310, in such a way as to include the second contact hole H2. The fourth contact hole H4 is defined to have a width smaller than the second contact hole H2.

Figure 3D:
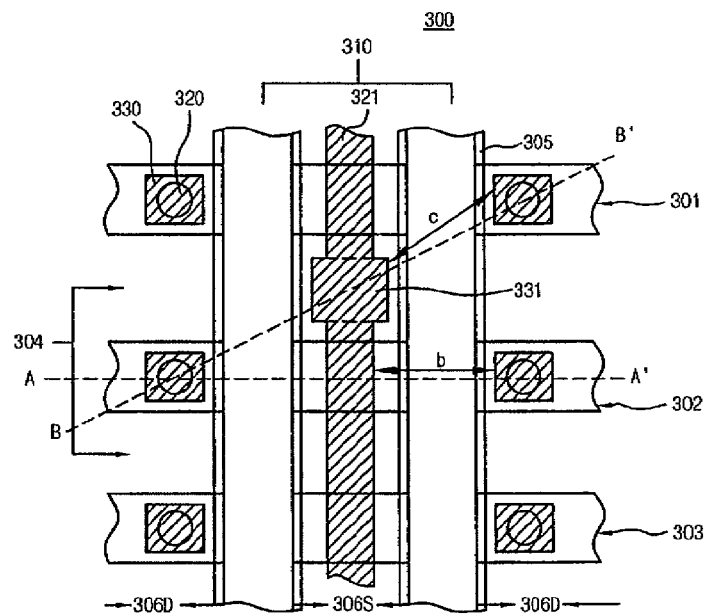
Figure 3D:
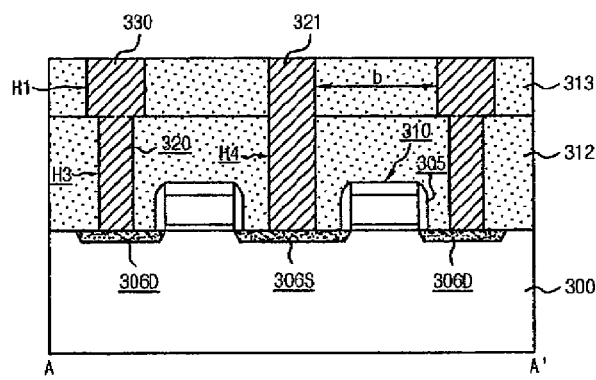
Figure 3D:
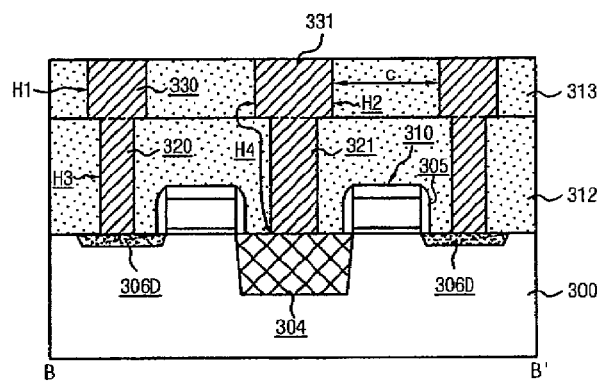

Referring to FIG. 3D, A conductive material is deposited on the second interlayer dielectric 313 in such a way as to fill the third contact hole H3, the first contact hole H1, the fourth contact hole H4, and the second contact hole H2. The conductive material is then CMPed (chemically and mechanically polished) until the second interlayer dielectric 313 is exposed. A dot type lower electrode 330 is formed in the first contact hole H1, and a first contact plug 320 is formed in the third contact hole H3. A second contact plug 321 is formed in the fourth contact hole H4, and a second contact plug 331 is formed in the second contact hole H2. The lower electrode 330 has a size greater than the first contact plug 320. The second contact plug 331 formed in the second contact hole H2, has a size (width) greater than the second contact plug 321.

Here, in the present invention, since the line type second contact plugs 321 and 331 are formed in the source regions 306S located on the active regions and the isolation structure 304 between the gate lines, when forming the lower electrode 330 in the drain region 306D, the distances 'b' and 'c' between the lower electrode 330 and the second contact plugs 321 and 331 can be increased when compared to the conventional art. Therefore, in the present invention, as the distance between the lower electrode 330 of the drain region 306D and the second contact plug 321 of the source region 306S (distance 'b') and the distance between the lower electrode 330 and the second contact plug 331 of the isolation structure (distance 'c') is increased, the leakage current generated between the drain region 306D and the source region 306S can be decreased.

Figure 3E:
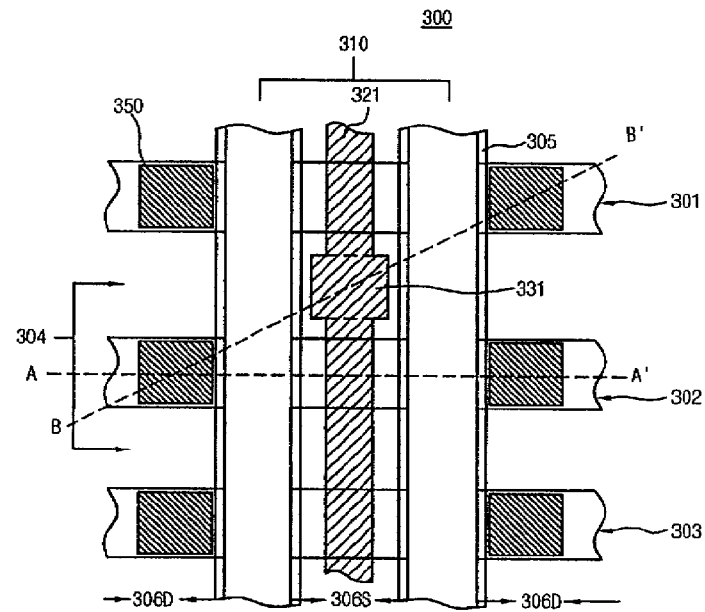
Figure 3E:
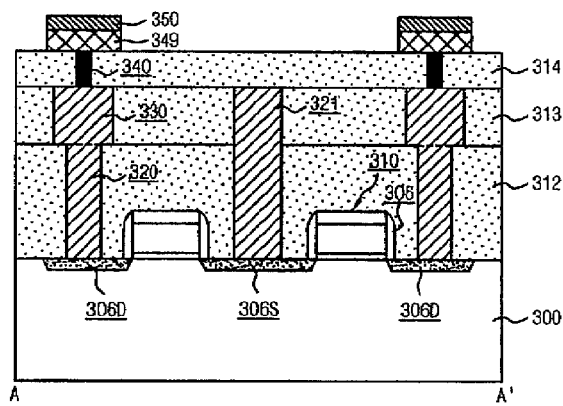
Figure 3E:
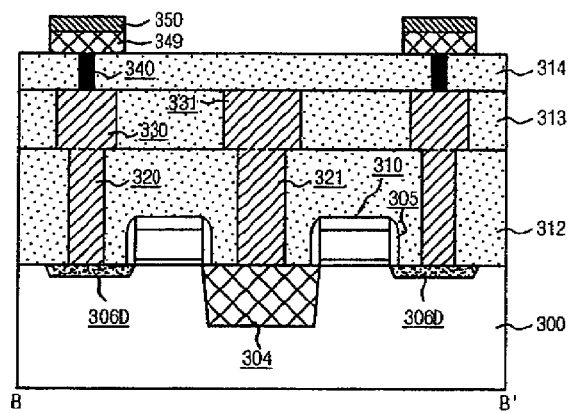

Referring to FIG. 3E, a third interlayer dielectric 314 is formed on the second interlayer dielectric 313, the lower electrode 330, and the second contact plugs 321 and 331. The third interlayer dielectric 314 is etched to form a contact hole for a lower electrode contact exposing the lower electrode 330. A conductive material for a lower electrode contact is deposited on the third interlayer dielectric 314 to fill the contact hole for a lower electrode contact. By CMPing the conductive material until the third interlayer dielectric 314 is exposed, a lower electrode contact 340, which comes into contact with the lower electrode 330, is formed in the contact hole for a lower electrode contact. A phase change material layer and a conductive material for an upper electrode are deposited on the third interlayer dielectric 314 and the lower electrode contact 340. The phase change material layer and the conductive material for an upper electrode are etched to form a phase change layer 349 and an upper electrode 350 on the lower electrode contact 340 and the portion of the third interlayer dielectric 314 around the lower electrode contact 340 in such a way as to come into contact with the lower electrode contact 340.

Figure 3F:
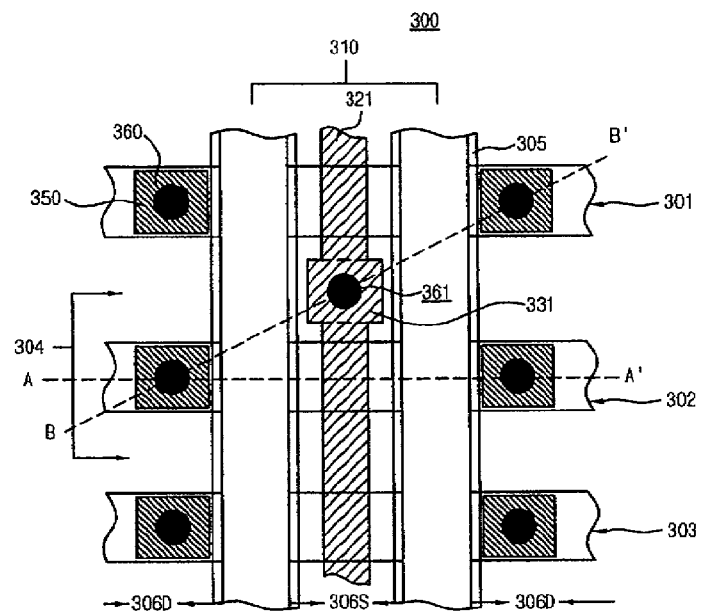
Figure 3F:
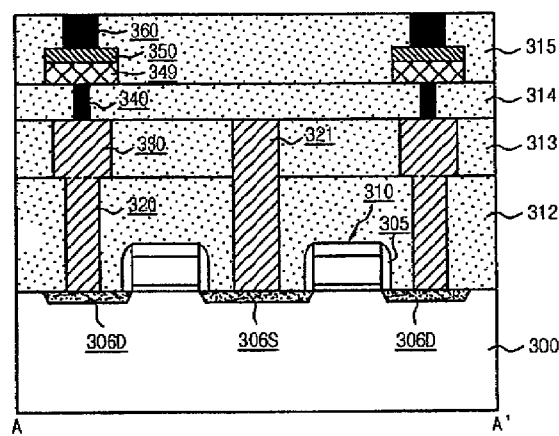
Figure 3F:
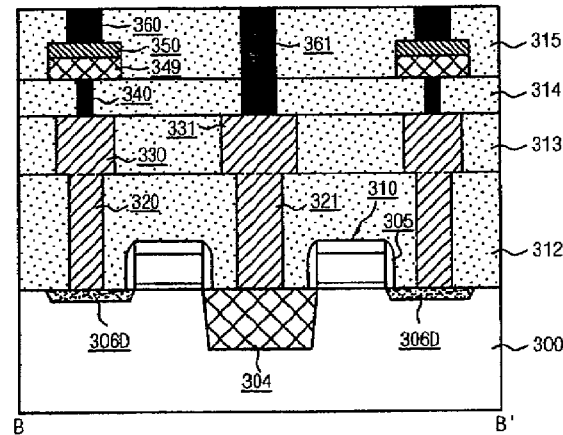

Referring to FIG. 3F, A fourth interlayer dielectric 315 is deposited on the third interlayer dielectric 314 to cover the upper electrode 350. The fourth interlayer dielectric 315 is etched to form a contact hole which exposes the upper electrode 350. A conductive material for an upper electrode contact is deposited on the fourth interlayer dielectric 315 to fill the contact hole for an upper electrode contact. By CMPing the conductive material until the fourth interlayer dielectric 315 is exposed, an upper electrode contact 360 is formed in the contact hole to come into contact with the upper electrode 350. A plurality of contacts 361 for ground lines are formed to come into contact with the second contact plugs 331 that are formed on the isolation structure 304 between the active regions. In FIG. 3F the contact 361 for ground lines is formed between the first active region 301 and the second active region 302. Here, the contacts 361 for ground lines are to be electrically connected with subsequently formed ground lines to allow a ground voltage to be applied to the source regions.

Figure 3G:
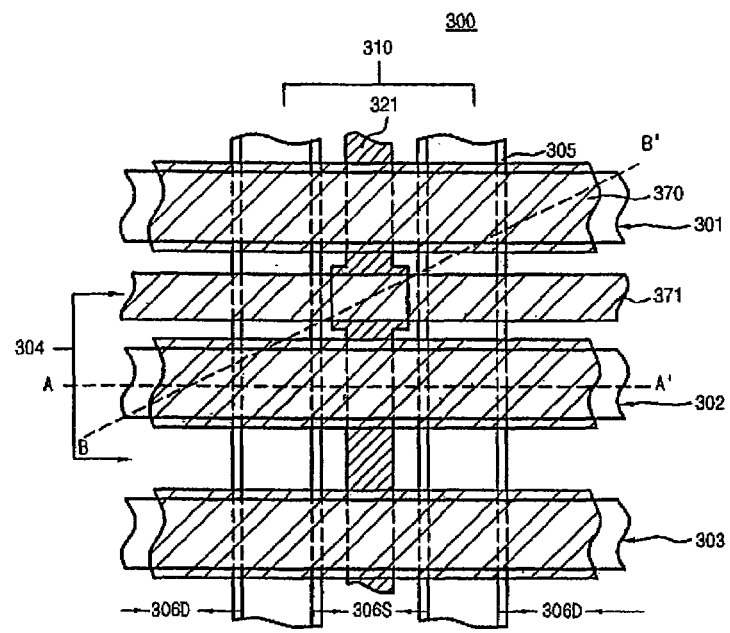
Figure 3G:
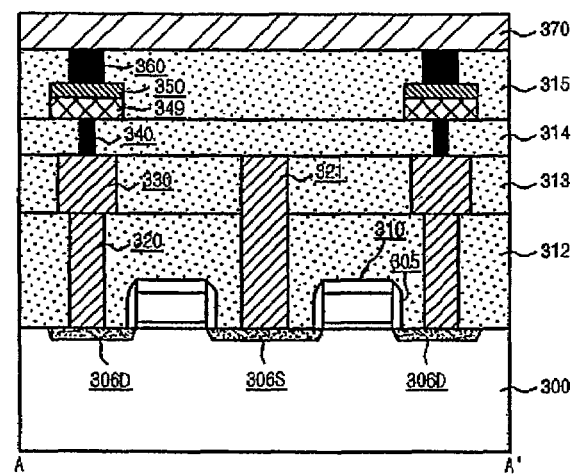
Figure 3G:
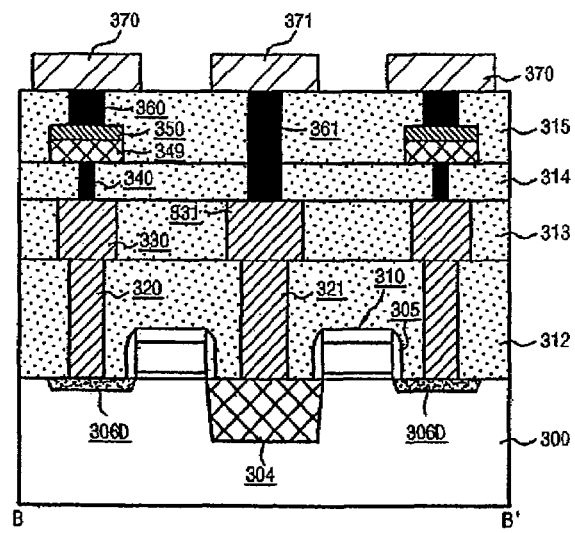

Referring to FIG. 3G, bit lines 370 are formed on the upper electrode contacts 360 and the fourth interlayer dielectrics 315 in the active regions 301, 302 and 303, and the bit lines are to be connected to the upper electrode contacts 360. Ground lines 371 are formed on the contacts 361 and the fourth interlayer dielectric 315, and the ground lines 371 are to be connected with the contacts 361 for ground lines which are formed between the active regions. In FIG. 3G, the ground line is connected between the first active region 301 and the second active region 302. The ground lines 371 are formed for predetermined bit line numbers so that a ground voltage can be stably formed.

As described above, in the present invention, due to the fact that the contact plugs are formed in the in the isolation structure, the distances between the lower electrodes formed in the drain regions and the portions of the contact plugs formed on the isolation structure are increased, making it possible to prevent a leakage current from being generated between the drain regions and the source regions.

Therefore, in the present invention, because the portions of the contact plugs, which come into contact with the ground lines, are formed in the isolation structure between active layers, and the distance between the lower electrode formed in the drain region and the contact plugs formed in the isolation structure is increased, it is possible to prevent a leakage current from being generated between the drain region and the source region.

FIGS. 4A through 4G are plan and cross-sectional views illustrating the process steps of a method for manufacturing a phase change memory device in accordance with still another embodiment of the present invention.

Figure 4A:
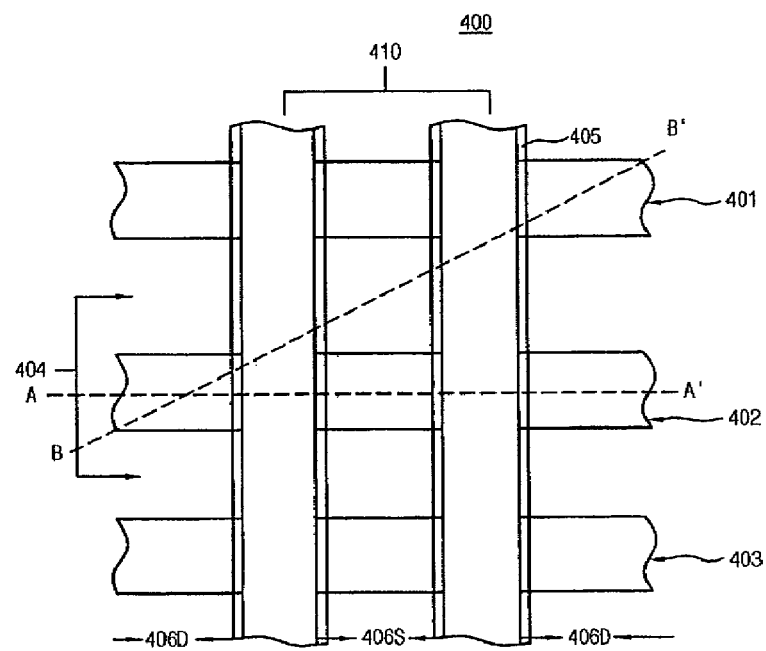
FIGS. 4A through 4G are plan and cross-sectional views illustrating the process steps of a method for manufacturing a phase change memory device in accordance with still another embodiment of the present invention.
Figure 4A:
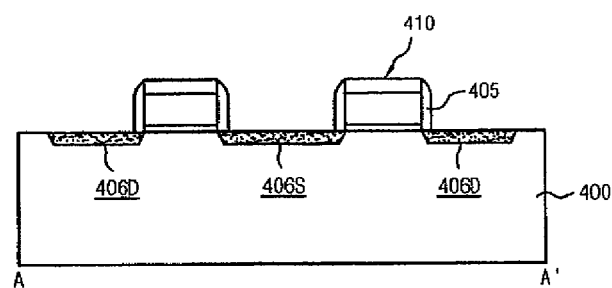
Figure 4A:
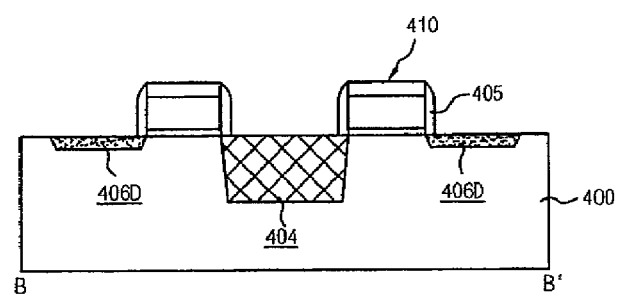

Referring to FIG. 4A, a semiconductor substrate 400 is prepared, in which a plurality of bar type active regions including a first active region 401, a second active region 402 and a third active region 403 are located to be spaced apart from one another and an isolation structure 404 is formed to delimit the plurality of active regions. The first through third active regions 401 through 403 are formed in a manner such that the distance between the first and second active regions 401 and 402 is greater than the distance between the second and third active regions 402 and 403. A plurality of gate lines 410 on the semiconductor substrate 400 are formed in such a way as to extend in the direction perpendicular to the active regions 401, 402 and 403. Spacers 405 are formed on both sidewalls of the gate lines 410. A source region 406S and a drain region 406D are formed in the surfaces of the active regions on both sides of each gate line 410.

Figure 4B:
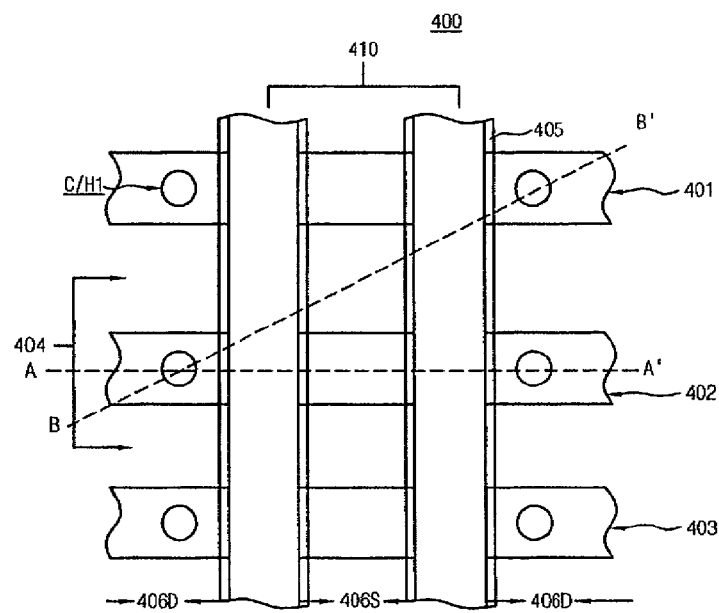
Figure 4B:
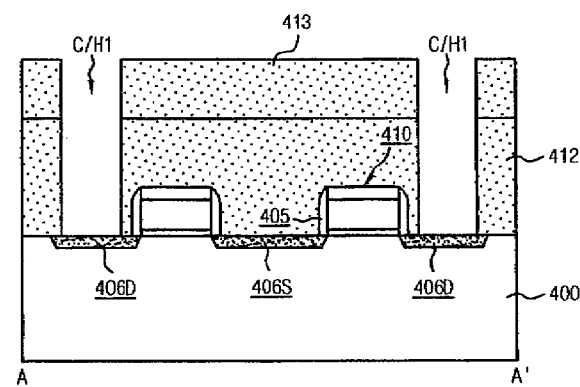
Figure 4B:
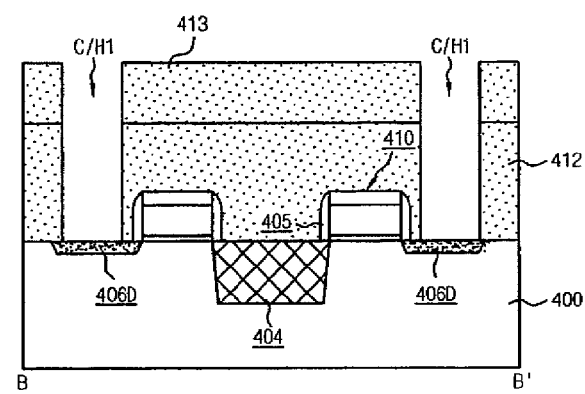

Referring to FIG. 4B, a first interlayer dielectric 412 and a second interlayer dielectric 413 are deposited on the overall surface of the semiconductor substrate 400 in such a way as to cover the gate lines 410. By etching the second interlayer dielectric 413 and the first interlayer dielectric 412, a first contact hole C/H1 is defined in the drain regions 406D in such a way as to delimit a contact plug forming zone.

Figure 4C:
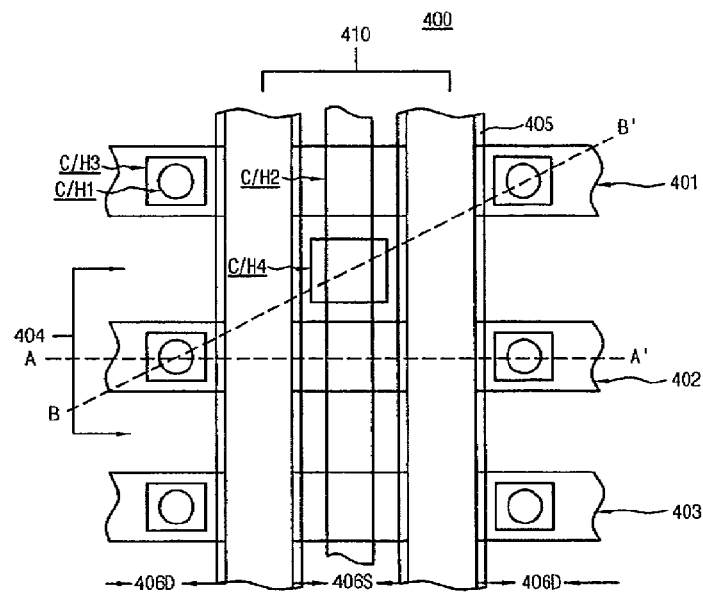
Figure 4C:
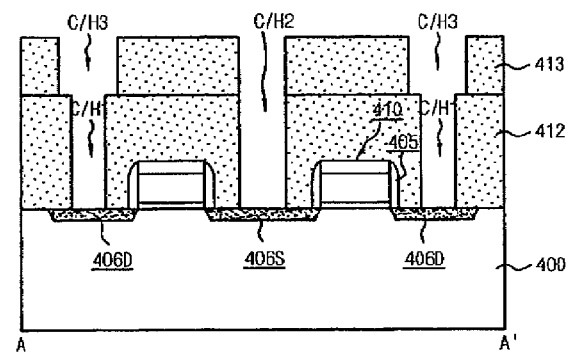
Figure 4C:
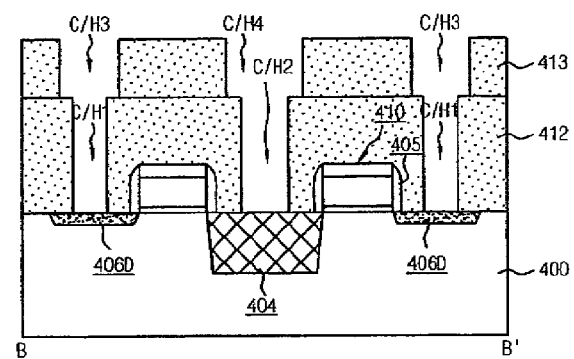

Referring to FIG. 4C, by etching the second interlayer dielectric 413 and the first interlayer dielectric 412, a second contact hole C/H2 is defined in the source regions 406S and the isolation structure 404. The second contact hole C/H2 is formed into a line type which is parallel to the gate line 410. Also, by etching the second interlayer dielectric 413, a third contact hole C/H3 is defined on the first contact hole C/H1 in such a way as to delimit a lower electrode forming zone in the drain areas 406D. A fourth contact hole C/H4 is defined on the second contact hole C/H2 in such a way as to expose a portion of the isolation structure 404 between the first active region 401 and the second active region 402. The third contact hole C/H3 is defined to have a size greater than the first contact hole C/H1, and the fourth contact hole C/H4 is defined to have a width greater than the second contact hole C/H2.

Figure 4D:
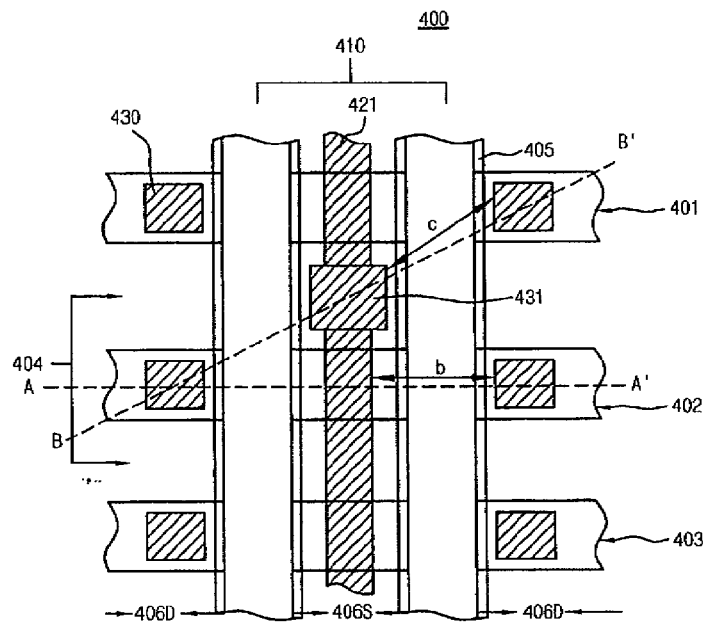
Figure 4D:
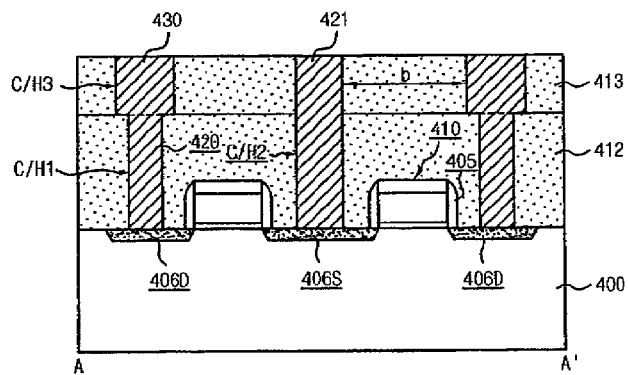
Figure 4D:
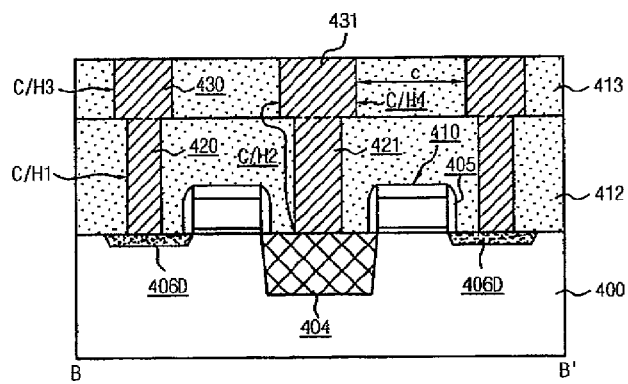

Referring to FIG. 4D, a conductive material is deposited on the second interlayer dielectric 413 in such a way as to fill the fourth contact hole C/H4, the third contact hole C/H3, the second contact hole C/H2 and the first contact hole C/H1. By CMPing (chemically and mechanically polishing) the conductive material until the second interlayer dielectric 413 is exposed, a dot type lower electrode 430 is formed in the third contact hole C/H3 and a first contact plug 420 is formed in the first contact hole C/H1 A second contact plugs 421 is formed in the second contact hole C/H2, which is located both in the source region 406S and the isolation structure (parallel to the gate line), and a second contact plug 431 is formed in the fourth contact hole C/H4, which is located in the isolation structure. The lower electrode 430 has a size greater than the first contact plug 420, and, the second contact plug 431 has a size (width) greater than the second contact plug 421.

Figure 4E:
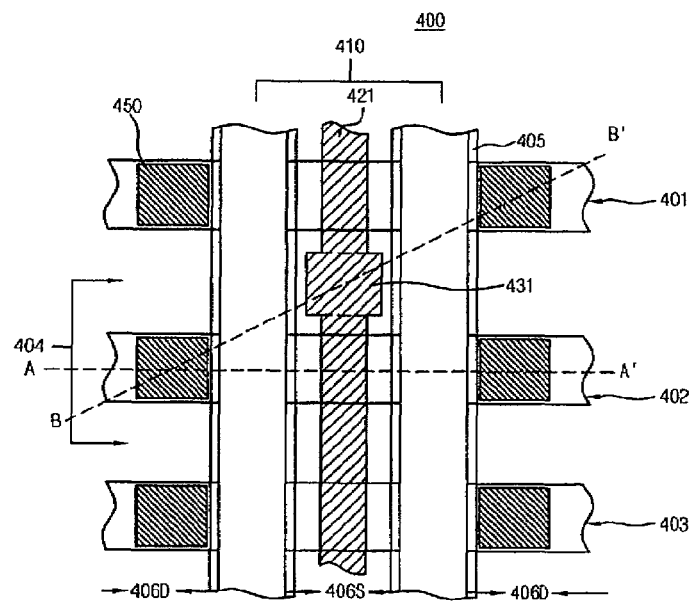
Figure 4E:
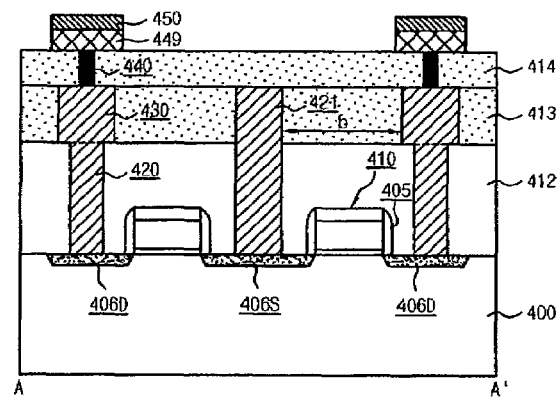
Figure 4E:
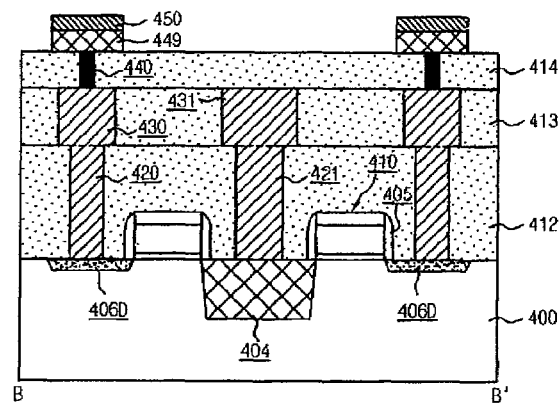

Referring to FIG. 4E, a third interlayer dielectric 414 is formed on the second interlayer dielectric 413, the lower electrode 430, and the second contact plugs 421 and 431. By etching the third interlayer dielectric 414, a contact hole for a lower electrode contact is defined to expose the lower electrode 430. A conductive material for a lower electrode contact is deposited on the third interlayer dielectric 414 to fill the contact hole for a lower electrode contact. By CMPing the conductive material until the third interlayer dielectric 414 is exposed, a lower electrode contact 440 is formed in the contact hole in such a way as to come into contact with the lower electrode 430. A phase change material layer and a conductive material for an upper electrode are deposited on the third interlayer dielectric 414 and the lower electrode contact 440. By etching the phase change material layer and the conductive material for an upper electrode, a phase change layer 449 and an upper electrode 450 are formed on the lower electrode contact 440 and the portion of the third interlayer dielectric 414 around the lower electrode contact 440 in such a way as to come into contact with the lower electrode contact 440.

Figure 4F:
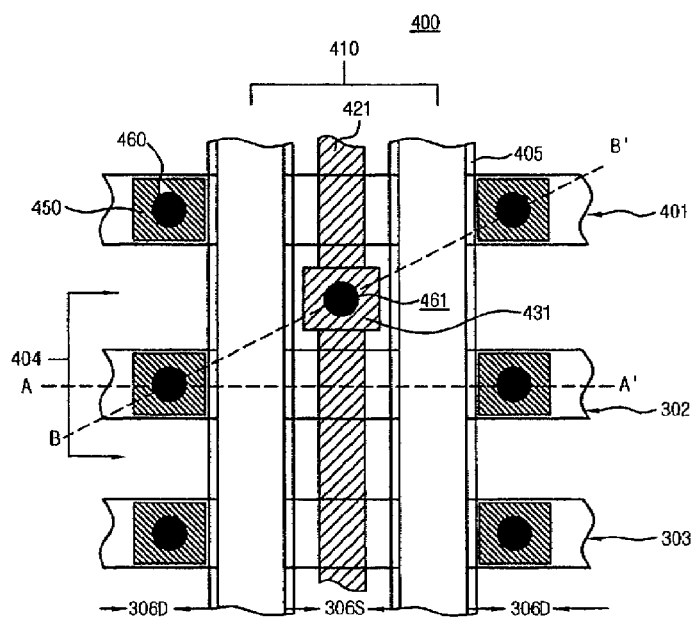
Figure 4F:
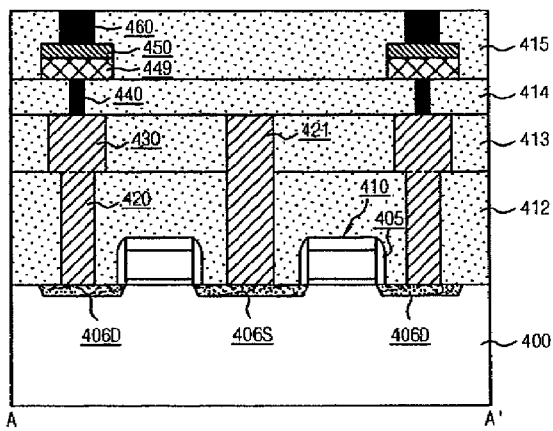
Figure 4F:
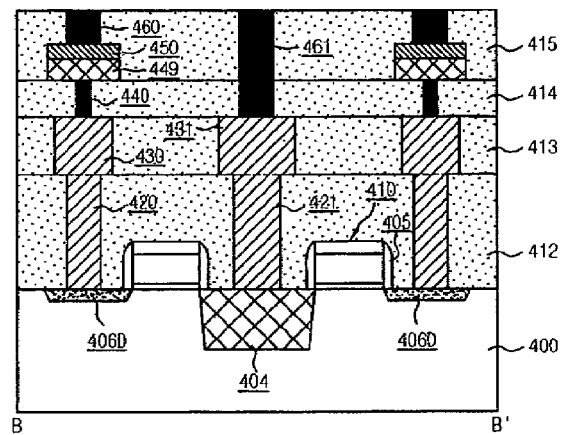

Referring to FIG. 4F, A fourth interlayer dielectric 415 is deposited on the third interlayer dielectric 414 to cover the upper electrode 450. By etching the fourth interlayer dielectric 415, a contact hole for an upper electrode contact is defined to expose the upper electrode 450. A conductive material for an upper electrode contact is deposited on the fourth interlayer dielectric 415 to fill the contact hole. By CMPing the conductive material until the fourth interlayer dielectric 415 is exposed, an upper electrode contact 460 is formed in the contact hole to come into contact with the upper electrode 450. A plurality of contacts 461 for ground lines are formed to come into contact with the second contact plugs 431 located on the isolation structure 404 between the active regions. Here, the contacts 461 for ground lines are to be electrically connected with subsequently formed ground lines to thereby allow a ground voltage to be applied to the source regions.

Figure 4G:
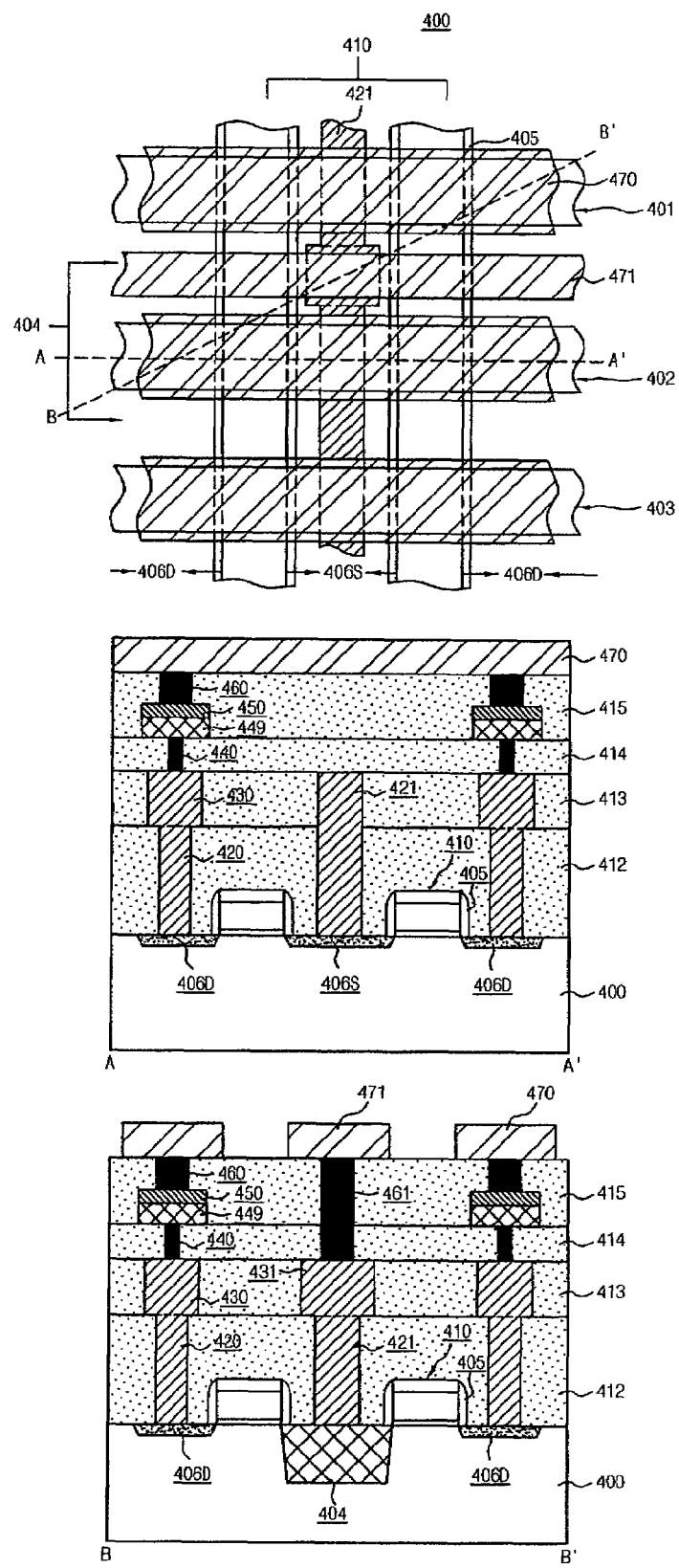

Referring to FIG. 4G, bit lines 470 are formed on the upper electrode contacts 460 and the fourth interlayer dielectrics 415 in the active regions 401, 402 and 403, and the bit lines 470 are to be connected to the upper electrode contacts 460. Ground lines 471 are formed on the contacts 461 for ground lines and the fourth interlayer dielectric 415, and the ground lines 471 are to be connected with the contacts 461 for ground lines. Here, the ground lines 471 are formed for predetermined bit line numbers so that a ground voltage can be stably formed.

As is apparent from the above description, in the present invention, due to the fact that contact plugs are formed in an isolation structure, the distances between lower electrodes formed in drain regions and the portions of the contact plugs formed on the isolation structure are increased, making it is possible to prevent a leakage current from being generated between the drain regions and the source regions.

Therefore, in the present invention, because the portions of the contact plugs, which come into contact with the ground lines, are formed in the isolation structure between active regions, and the distance between the lower electrode formed in the drain region and the contact plugs formed in the isolation structure is increased, it is possible to prevent a leakage current from being generated between the drain region and the source region.

Although specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A phase change memory device comprising:
    a plurality of gate lines formed to extend in a first direction on a semiconductor substrate having a plurality of active regions;

source regions and drain regions formed in the active regions on first sides and second sides opposite the first sides of the gate lines;

contact plugs formed in the shape of a line between the gate lines;

a lower electrode, a phase change layer and an upper electrode successively formed over the drain regions; and a plurality of contacts for ground lines formed between the active regions, wherein the contact plugs comprise first portions contacting the contacts for ground lines and second portions directly contacting the first portions and extending laterally in the first direction between the gate lines and away from the first portions so as to have the line shape, wherein the first portions of the contact plugs have a line width that is greater than that of the second portions.

2. The phase change memory device according to claim 1, wherein the first portions of the contact plugs which contact the contacts for ground lines are formed between active regions.

* * * * *